United States Patent
Hawryluk et al.

(10) Patent No.: US 8,299,446 B2
(45) Date of Patent: Oct. 30, 2012

(54) SUB-FIELD ENHANCED GLOBAL ALIGNMENT

(75) Inventors: Andrew M. Hawryluk, Los Altos, CA (US); Emily True, San Ramon, CA (US); Manish Ranjan, San Jose, CA (US); Warren Flack, San Jose, CA (US); Detlef Fuchs, Fair Oaks, CA (US)

(73) Assignee: Ultratech, Inc., San Jose, CA (US)

( * ) Notice: Subject to any disclaimer, the term of this patent is extended or adjusted under 35 U.S.C. 154(b) by 387 days.

(21) Appl. No.: 12/803,344

(22) Filed: Jun. 24, 2010

(65) Prior Publication Data

US 2011/0038704 A1    Feb. 17, 2011

Related U.S. Application Data

(60) Provisional application No. 61/274,012, filed on Aug. 12, 2009.

(51) Int. Cl.
*G06F 17/50* (2006.01)
*G03B 27/00* (2006.01)
*G03B 27/52* (2006.01)

(52) U.S. Cl. ........... 250/491.1; 250/492.1; 250/492.2; 250/492.22

(58) Field of Classification Search .......... 250/491.1, 250/492.1, 492.2, 492.22
See application file for complete search history.

(56) References Cited

U.S. PATENT DOCUMENTS

| | | | | |
|---|---|---|---|---|
| 4,613,981 A * | 9/1986 | Siddall et al. | ..... | 378/34 |
| 5,253,182 A * | 10/1993 | Suzuki | ..... | 430/30 |
| 5,337,247 A * | 8/1994 | Hamaguchi | ..... | 700/121 |
| 5,422,491 A * | 6/1995 | Sakamoto | ..... | 250/492.22 |
| 5,487,172 A * | 1/1996 | Hyatt | ..... | 712/32 |
| 5,907,857 A * | 5/1999 | Biswas | ..... | 711/106 |
| 5,929,454 A * | 7/1999 | Muraki et al. | ..... | 250/491.1 |
| 6,064,807 A * | 5/2000 | Arai et al. | ..... | 430/30 |
| 6,072,184 A * | 6/2000 | Okino et al. | ..... | 250/492.2 |
| 6,133,987 A * | 10/2000 | Stumbo | ..... | 355/67 |
| 6,709,880 B2 * | 3/2004 | Yamamoto et al. | ..... | 438/22 |
| 6,822,248 B2 * | 11/2004 | Ferrera et al. | ..... | 250/492.22 |
| 6,835,511 B2 * | 12/2004 | Hirayanagi | ..... | 430/22 |
| 7,462,848 B2 * | 12/2008 | Parker | ..... | 250/492.23 |
| 7,512,508 B2 * | 3/2009 | Rajski et al. | ..... | 702/118 |
| 8,027,018 B2 * | 9/2011 | Opower et al. | ..... | 355/53 |
| 8,120,748 B2 * | 2/2012 | Geh et al. | ..... | 355/27 |
| 8,154,633 B2 * | 4/2012 | Gloudemans et al. | ..... | 348/251 |
| 8,214,773 B2 * | 7/2012 | Lu et al. | ..... | 716/54 |
| 8,248,581 B2 * | 8/2012 | Opower et al. | ..... | 355/67 |
| 2006/0066338 A1 * | 3/2006 | Rajski et al. | ..... | 324/765 |
| 2006/0066339 A1 * | 3/2006 | Rajski et al. | ..... | 324/765 |
| 2006/0145097 A1 * | 7/2006 | Parker | ..... | 250/492.22 |
| 2006/0265185 A1 * | 11/2006 | Lanzerotti et al. | ..... | 702/181 |
| 2011/0038704 A1 * | 2/2011 | Hawryluk et al. | ..... | 414/800 |

* cited by examiner

*Primary Examiner* — David A Vanore
(74) *Attorney, Agent, or Firm* — Opticus IP Law PLLC

(57) ABSTRACT

Sub-field enhanced global alignment (SEGA) methods for aligning reconstituted wafers in a lithography process are disclosed. The SEGA methods provide the ability to accommodate chip placement errors for chips supported by a reconstituted wafer when performing a lithographic process having an overlay requirement. The SEGA methods include measuring chip locations to determine sub-fields of the reconstituted wafer over which enhanced global alignment (EGA) can be performed on the chips therein to within the overlay requirement. The SEGA methods further included individually performing EGA over the respective sub-fields. The SEGA methods take advantage of the benefits of both EGA and site-by-site alignment and are particularly applicable to wafer-level packing lithographic processes such as fan-out wafer-level packaging.

20 Claims, 12 Drawing Sheets

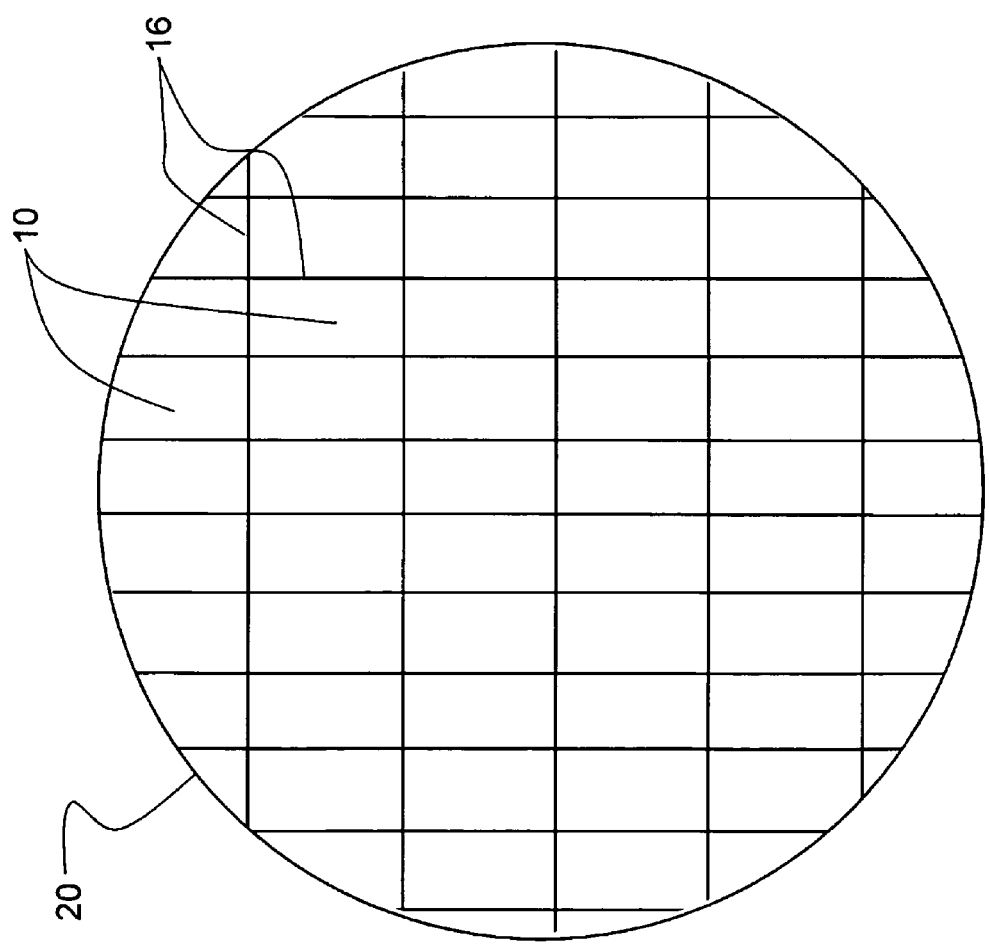

SUB-FIELD ENHANCED GLOBAL ALIGNMENT

CLAIM OF PRIORITY

This application claims the benefit of priority under 35 U.S.C. §119(e) of U.S. Provisional Application Ser. No. 61/274,012, entitled "Sub-field enhanced global alignment for lithography in fan-out wafer-level packaging," filed on Aug. 12, 2009, which application is incorporated by reference herein.

FIELD

The present disclosure relates generally to lithography and semiconductor manufacturing, and in particular relates to methods of performing alignment of reconstituted wafers in a lithographic process that has an overlay requirement.

BACKGROUND ART

Leading edge consumer electronic products demand innovative and cost-effective packaging solutions. While front end silicon technologies have followed Moore's law by device scaling, the back end infrastructure has lagged in similar advancements. This has created an interconnect gap whereby the signal speed achieved on the silicon side is significantly higher than the speed achieved on the printed circuit boards. To this end, innovative advancements in the back-end processing, such as fan-out wafer level packaging technology, have been developed that deliver robust packaging solutions to meet the performance and reliability requirements for leading edge devices such as wireless chips.

Fan-out wafer level packaging technology addresses the pad limitations associated with conventional wafer level packaging techniques and has miniaturization and potential low cost packaging advantages. It also enables high-performance bump interconnects with input/output (I/O) counts exceeding the capacity of the original front-end chip size. The bump array area for each chip is increased by populating a composite wafer with tested "known good" chips at a larger repeat pitch than the original wafer. The reconstituted wafer preferably has the size and shape of a standard silicon wafer, thereby allowing the use of existing wafer processing equipment for subsequent handling and processing. For compatibility with planar processing steps, the chip surface needs to be coplanar with the wafer molding compound. Also the X, Y, and θ positioning of each chip needs to be accurate within the grid to maintain registration performance while patterning multiple chips per exposure.

Chip positioning control within a reconstituted wafer is one of the key factors affecting the downstream process requirements. While considerable improvements have been made with the chip pick and place equipment, it is difficult to control the shift of the silicon chip during the compression molding process. This creates significant alignment challenges during the subsequent photolithography process steps.

SUMMARY

The present disclosure relates generally to lithography and semiconductor manufacturing, and in particular relates to methods of performing sub-field enhanced global alignment (SEGA) for lithography processes such as wafer-level packaging. The SEGA methods disclosed herein provide the ability to accommodate placement errors (particularly random placement errors) in the location of chips disposed on a reconstituted wafer in the process of performing lithographic processes like fan-out wafer-level packing.

An aspect of the disclosure is a method of performing alignment in a lithography process having an overlay requirement. The method includes providing at least one reconstituted wafer that includes a plurality of chips supported by a carrier and arranged at different locations, wherein the chip locations preclude performing a single enhanced global alignment of the chips over the entire wafer within the overlay requirement. The method also includes measuring the chip locations on the at least one reconstituted wafer. The method also includes identifying, based on the measured chip locations, two or more sub-fields of the reconstituted wafer where enhanced global alignment can be separately performed to within the overlay requirement. The method further includes performing separate enhanced global alignments within the respective two or more sub-fields.

Another aspect of the disclosure is a method of aligning chips placed on a reconstituted wafer in a lithography process. The method includes establishing two or more sub-fields on the reconstituted wafer wherein a given systematic and random error in the chip placement is within the overlay requirement. The method also includes performing respective two or more enhanced global alignments of one or more chips within the respective two or more sub-fields.

Another aspect of the disclosure is a method of performing alignment of reconstituted wafers in a lithography process having an overlay requirement. The method includes forming a first set of multiple reconstituted wafers each having a carrier with chips operably supported thereby at different locations such that a single enhanced global alignment cannot be performed for all of the chips on a given reconstituted wafer in the first set. The method also includes measuring the chip locations on the multiple wafers. The method also includes determining, based on the measured chip locations, sub-fields over which enhanced global alignment can be performed within the overlay requirement.

Additional features and advantages of the disclosure are set forth in the detailed description which follows, and in part will be readily apparent to those skilled in the art from that description or recognized by practicing the disclosure as described herein, including the detailed description which follows, the claims, as well as the appended drawings.

It is to be understood that both the foregoing general description and the following detailed description present embodiments of the disclosure, and are intended to provide an overview or framework for understanding the nature and character of the disclosure as it is claimed. The accompanying drawings are included to provide a further understanding of the disclosure, and are incorporated into and constitute a part of this specification. The drawings illustrate various embodiments of the disclosure, and together with the description serve to explain the principles and operations of the disclosure.

BRIEF DESCRIPTION OF THE DRAWINGS

FIG. 1 is a plan view of an example prior art arrangement of chips on a wafer for a typical integrated device layout;

Figure 2A:
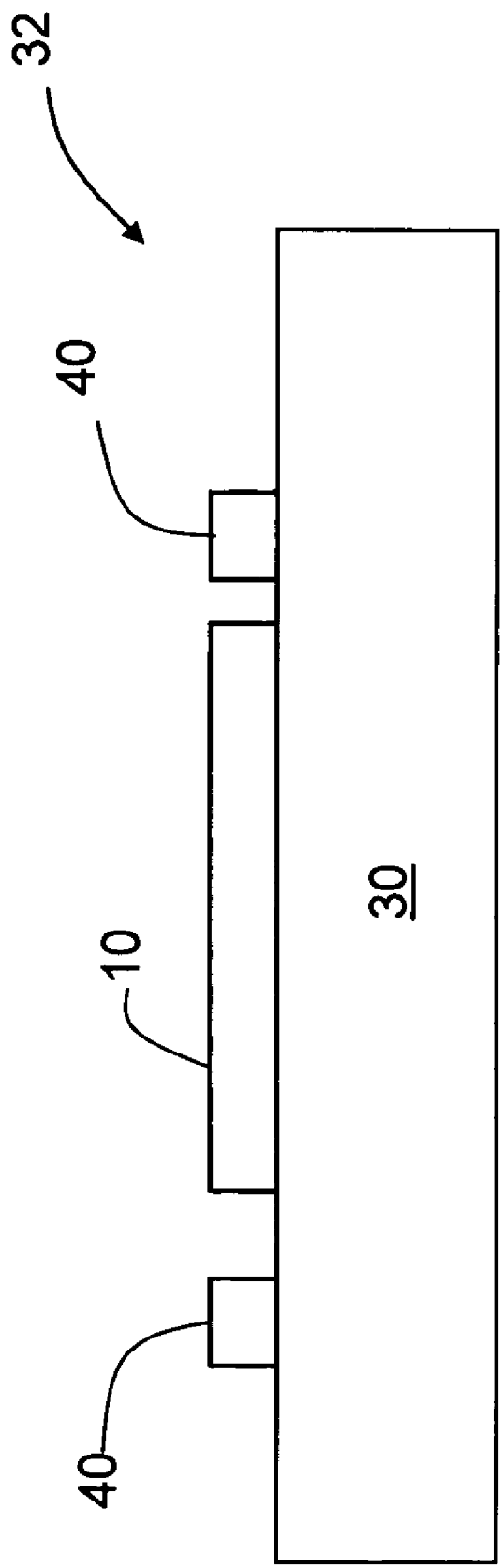
FIG. 2A and FIG. 2B are respective side and top views of a packaged chip that includes a chip supported by a package substrate ("package") having a large number of contact pads formed thereon.

The various elements depicted in the drawing are merely representational and are not necessarily drawn to scale. Certain sections thereof may be exaggerated, while others may be minimized. The drawing is intended to illustrate an example embodiment of the disclosure that can be understood and appropriately carried out by those of ordinary skill in the art.

DETAILED DESCRIPTION

Reference is now made in detail to the present preferred embodiments of the disclosure, examples of which are illustrated in the accompanying drawings. Whenever possible, the same reference numbers and symbols are used throughout the drawings to refer to the same or like parts.

The present disclosure relates generally to lithography and semiconductor manufacturing, and in particular relates to SEGA methods lithography processes that have an overlay requirement, such as wafer-level packing, and in particular fan-out wafer-level packaging. The SEGA methods disclosed herein provide the ability to accommodate random placement errors in the location of chips disposed on a reconstituted wafer to perform alignment that falls within the overlay requirement.

Wafer-Level Packaging

Lithography is commonly used in the semiconductor industry and the micro-electrical-mechanical systems (MEMS) industry for fabricating devices. In fact, lithography is seen as the technology driver for advancing Moore's law in the quest to produce smaller and smaller transistors. Recently, lithography has started to play a more important role in the "back end" of semiconductor fabrication or more specifically, in the packaging area. Previously, packaging was dominated by wire-bonding. More recently, non-critical layer lithography (i.e., low resolution lithography, typically 1 to 50 microns) is being used to pattern interconnects between silicon devices on reconstituted substrates.

The manufacturing of the basic semiconductor integrated circuit is typically done on large (150 to 300 mm diameter, or equivalent) silicon wafers. As processing costs are very expensive, every effort is made to maximize the number of integrated circuits on a single wafer.

FIG. 1 is a plan view of an example prior art arrangement of chips (dies) 10 on a wafer 20 for a typical integrated device layout. Chips 10 are within the marked lines 16 and are placed as close as possible to maximize yield and minimize fabrication costs. As a result, there is very little space in between the integrated circuits (chips) 10. The area between the chips 10 is generally the minimum area required to singulate the chips from the wafer. Thus, line 16 is often called the "scribe line" and is typically approximately 50-100 microns wide.

As modern integrated devices become more complex and have more capability, the devices themselves require a greater number of input and output connections. As a result, packaging the chip is becoming an area of intense activity. A fundamental problem is that the size of the package is often much greater than the size of the chip itself.

Figure 2B:
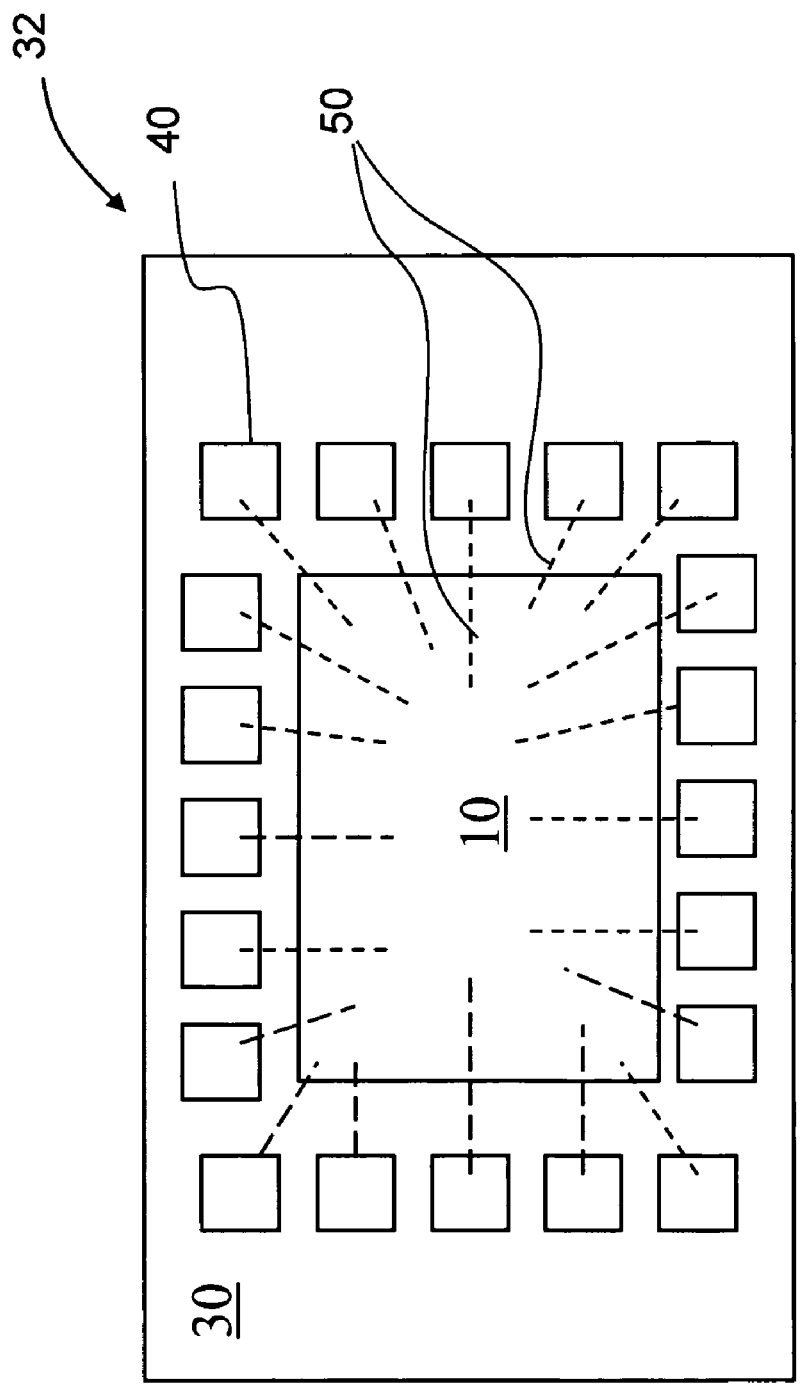

FIG. 2A and FIG. 2B are respective side and top views of a chip 10 on a package substrate ("package") 30 having a large number of contact pads 40 formed thereon. The assembly shown in FIG. 2A and FIG. 2B is referred to herein as a "packaged chip" 32. A modern day packaged chip 32 may have several hundred contact pads 40. The contact pads 40 are large enough (typically 50 to 100 microns in size, but can be as small as 1 micron) to make macroscopic contact (for example, using wire bonding or thru silicon vias) to other chips, devices or circuit boards. Additionally, routing lines 50 are added between the individual contact pads 40 and the relevant area on the chip, shown as dotted lines in FIG. 2B. These routing lines 50 are often fabricated with lithography. Notice that the contacts 40 electrically connected to chip 10 extend outside of the chip. The contacts 40 "fan-out" from the chip, and hence, this process has become known as "fan-out packaging".

Figure 3:
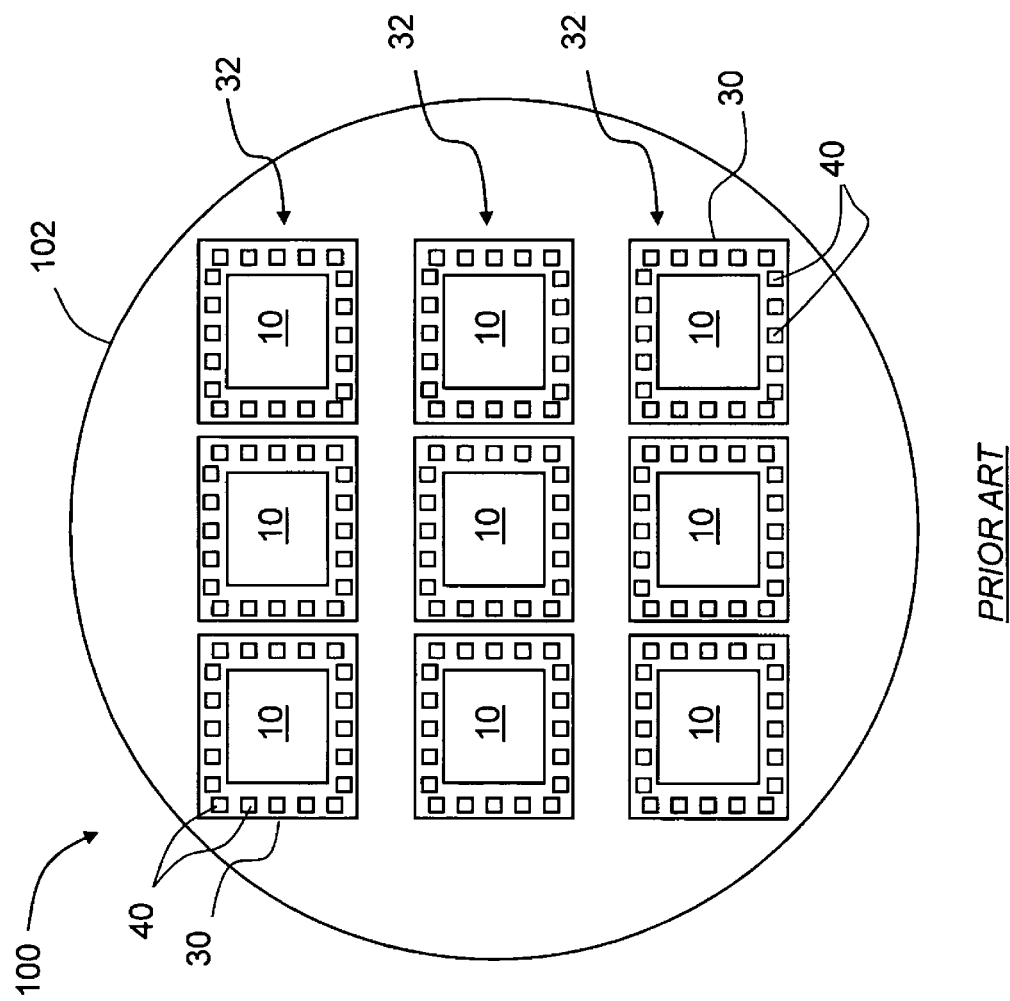
FIG. 3 is a plan view of an example reconstituted wafer that includes a regular arrangement of packaged chips arranged on a carrier.

Because of the relatively large size of package 30, it is impossible to integrate the packaging process onto the original silicon wafer 20. As a result, a new trend in packaging is to create a "reconstituted wafer." FIG. 3 is a plan view of an example reconstituted wafer 100 where the chips 10 are cut from the original wafer 20, are packaged to form packaged chips 32, and the packaged chips are placed onto a carrier 102. The separation between chips 10 is greater than that associated with the separation associated with the scribe lines 16 of the original wafer 20. Carrier 102 need not be composed of silicon and can, for example, be made from the package material and is also generally the size of a typical silicon wafer so that conventional silicon processing equipment can be used for additional processing. By placing the chips 10 farther apart on the less expensive reconstituted wafer 100, there is now sufficient room to make all the contacts needed for subsequent packaging.

Figure 4A:
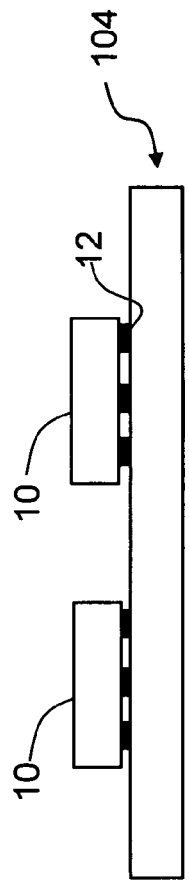
FIG. 4A though FIG. 4F illustrated the fundamental fan-out process flow.
Figure 4B:
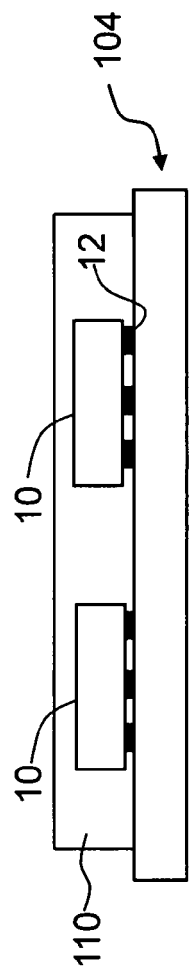
Figure 4C:
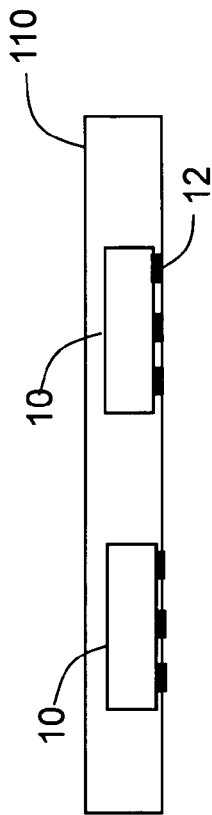
Figure 4D:
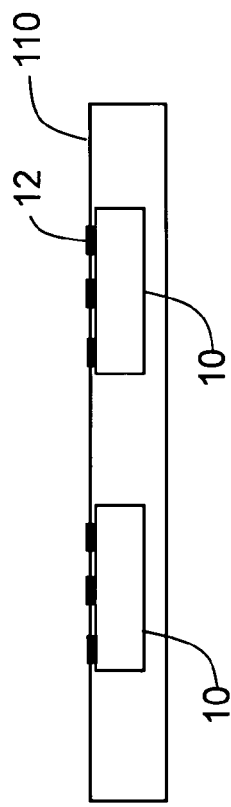
Figure 4E:
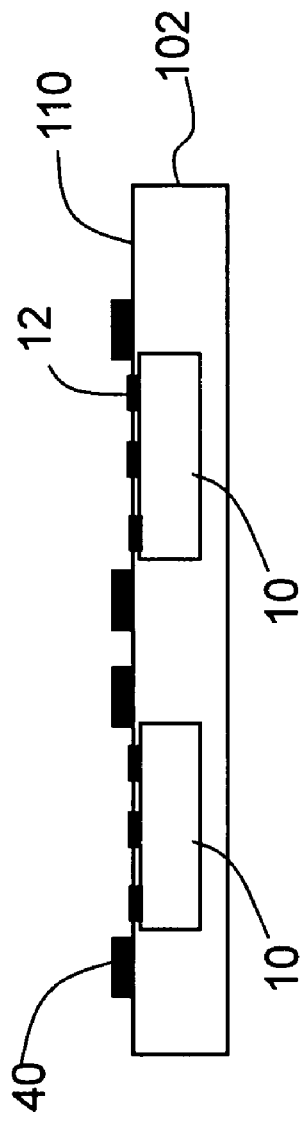
Figure 4F:
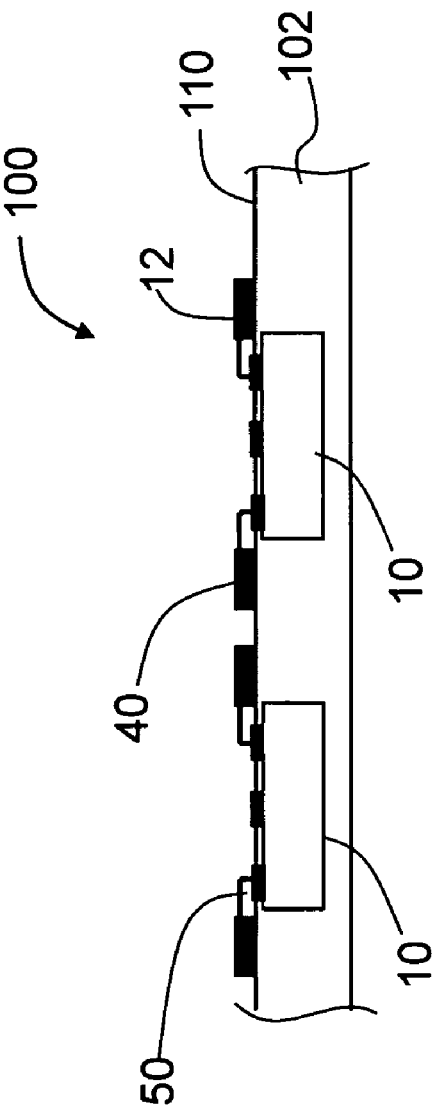

The fundamental process flow associated with fan-out packaging process is illustrated in FIG. 4A though FIG. 4F. In the first step shown in FIG. 4A, individual chips 10 are singulated from a wafer 20 and assembled onto a temporary carrier 104 using a conventional pick and place machine. Only a section of temporary carrier 104 and two chips supported thereby is shown for the sake of illustration. Chips 10 have chip contacts 12. One option is to test the individual chips and only form the reconstituted wafer using known good chips 10.

With reference to FIG. 4B, the chips 10 are then embedded in a material 110 that is allowed to dry and harden. Once hardened, material 110 serves as a protective layer and becomes carrier 102 of the reconstituted wafer 100.

With reference to FIG. 4C, the temporary carrier 104 is removed, leaving chips 10 supported by (e.g., embedded in) material 110 (i.e., carrier 102).

With reference to FIG. 4D, the hardened material 110 with chips 10 embedded therein is then inverted so that subsequent processing (such as lithography, plating or etching) can be performed. At this point, lithography is used to define contact pads 40 on the hardened material 110, as shown in FIG. 4E, and to make electrical connections 50 between the contact pads and relevant functional blocks within the chip via chip contacts 12, as shown in FIG. 4F. The result is a reconstituted wafer 100 having a fan-out configuration like that shown in idealized version of FIG. 3, with only a portion of the reconstituted wafer being shown in FIG. 4F.

Figure 5A:
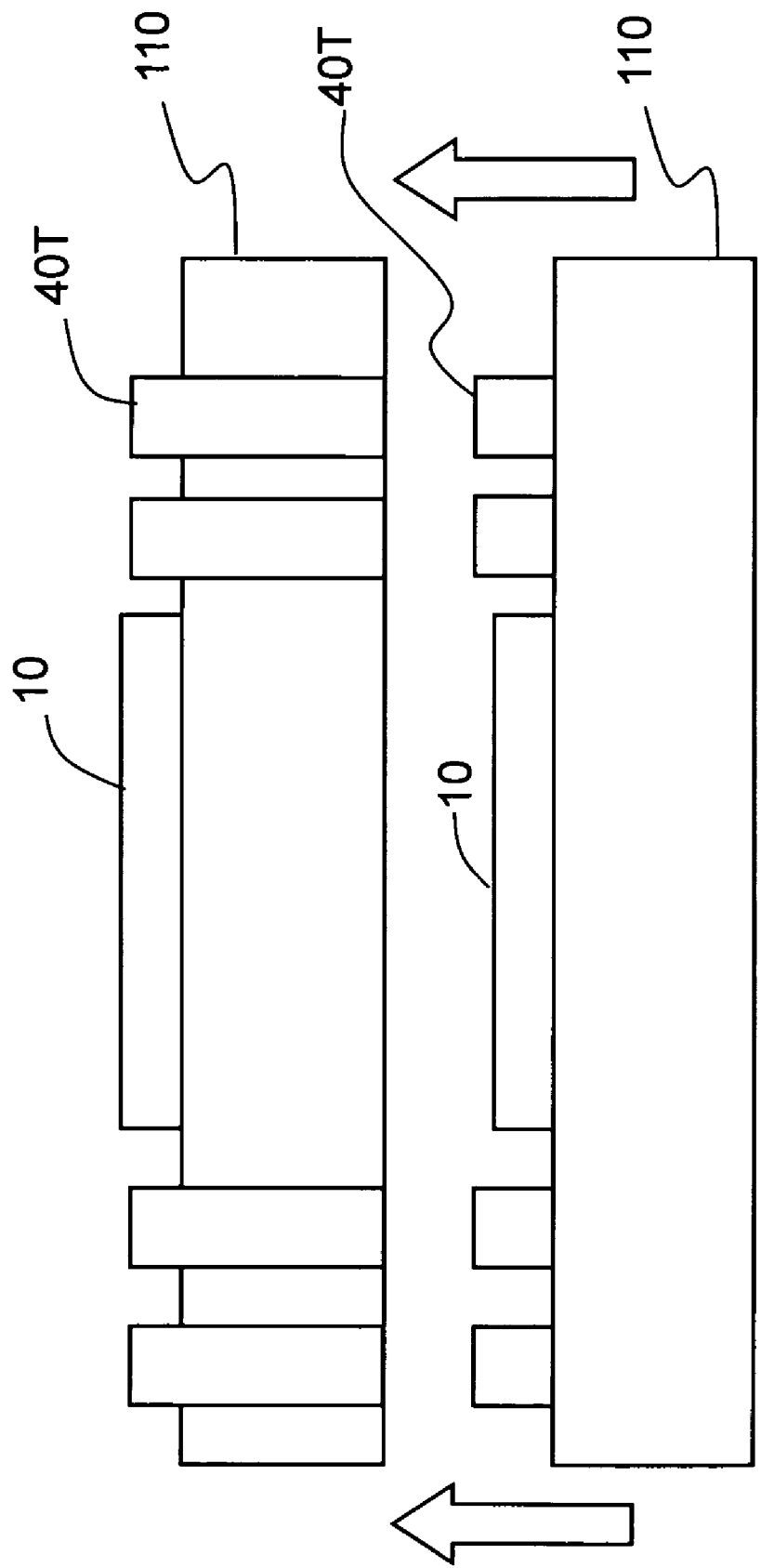
FIG. 5A and FIG. 5B illustrate an advanced form of fan-out wafer level packaging wherein the individual contact pads are be made as thru-vias with the packaged chips arranged in a stacked geometry.
Figure 5B:
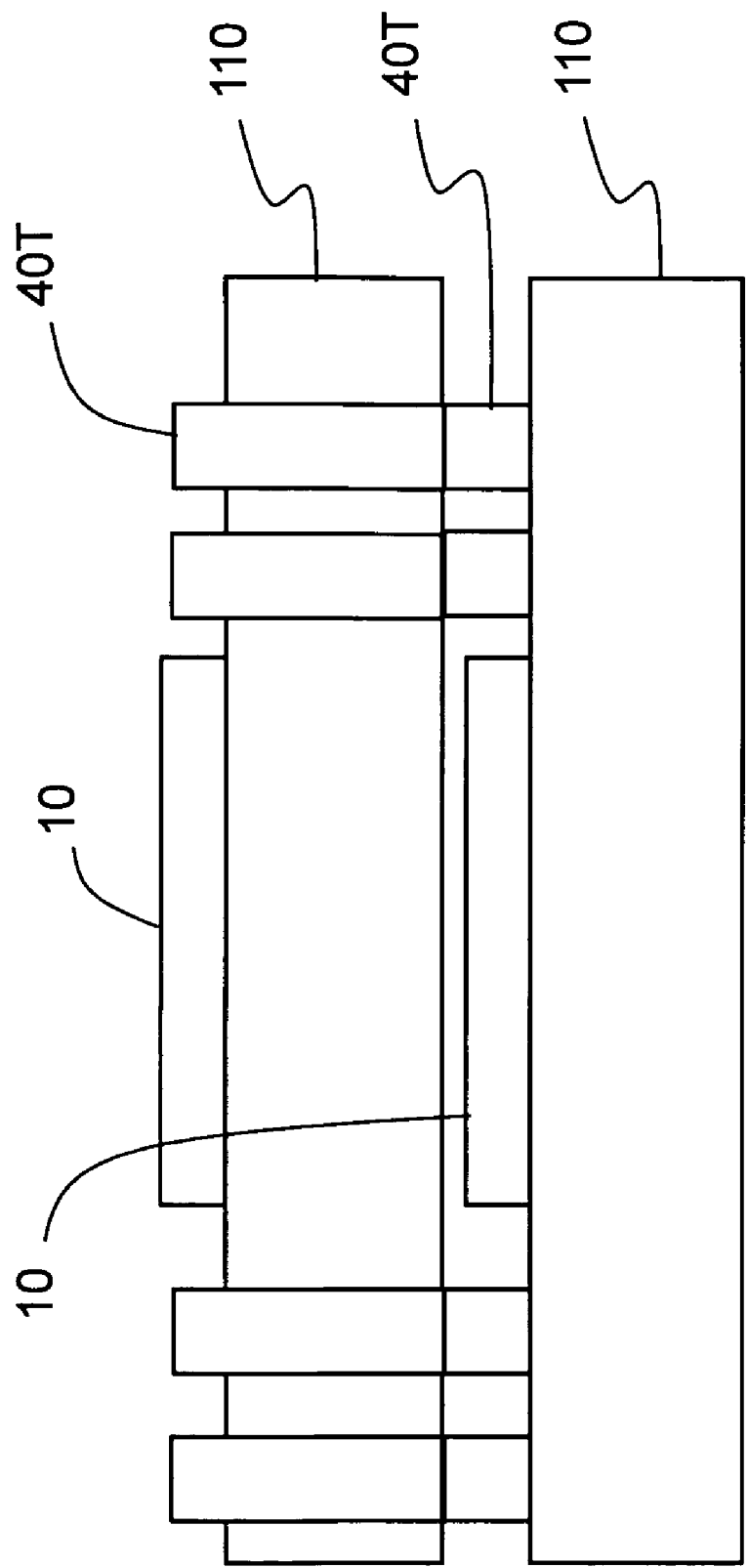

In an advanced form of fan-out wafer level packaging, the individual contact pads 40 can be made as "thru-vias" 40 T, where they extend from the top to the bottom of the package. In this embodiment, chips can be stacked as shown in FIG. 5A and FIG. 5B.

Alignment of Reconstituted Wafers

The difficulty of aligning reconstituted wafers 100 as part of a lithographic process having an overlay requirement is that the location of the individual chips 10 within the reconstituted wafer 100 is often poorly controlled. The placement of chips 10 can be affected by the accuracy and repeatability of the pick and place machine, as well as the hardening process of the package material, which will tend to shrink in a non-uniform manner across the area. As a result, chips 10 are not regularly spaced. After hardening of the packaging material 110, the individual chips 10 embedded therein generally have random location errors that are approximately 5-25 microns. Consequently, conventional lithographic equipment used in the back-end processing, e.g., to define the contact pads, the thru-vias and the connections between the contact pads and the functional blocks, etc., have difficulty meeting the overlay requirements for the subsequent processing steps associated with wafer-level packaging (e.g., sputtering, photolithography, electroplating, ball-drop process, etc.).

Normal lithographic tools are used to expose patterns on silicon wafers 20 where the chips 10 are located in a very precise array, such as shown in FIG. 1. Often, the location of the individual chips 10 is accurate to a few nanometers. Lithographic tools typically identify and locate a small number of global alignment marks (typically 3-5 marks), and from these marks and with other information provided through the alignment recipe, the tool calculates the Cartesian coordinate system and the location of each individual chip 10 on the wafer 20. This is the basis for the EGA (Enhanced Global Alignment) technique. This approach can accommodate linear corrections to the coordinate system (i.e., linear magnification terms in x, and y, and a rotation angle $\theta$ between the two coordinate systems). A problem, however, is that normal lithographic tools do not have the capability to accommodate large random or systematic location errors in the position of the chips or errors that cannot be modeled by a linear correction term. Thus, they cannot carry out EGA over all the chips in a single operation while satisfying the overlay requirements of the lithographic process.

Additional problems can occur during material handling of reconstituted wafers 100. The reconstituted wafer 100 is not as flat and regular as a silicon wafer 20. In fact, the reconstituted wafer 100 typically is hundreds of microns out-of-flat. As a result, conventional material handling techniques and tools (e.g., robots and end-effectors) and conventional pre-aligners and traditional stages associated with conventional lithography tools do not handle and process these reconstituted wafers well, thereby adding to wafer placement errors during back-end processing.

Another problem is that chips 10 are not placed exactly in a regular array. The locations of chips 10 have a random error component due to the limited accuracy of the pick and place tool, and due to the shrinkage of the packaging material 110 as it hardens to form carrier 102. The packaging material shrinkage is likely to be material dependent and location dependent. Thus, chips 10 in the center of carrier 102 may have less shrinkage-induced shift than chips near the edge of the carrier. With an unknown chip location, it becomes difficult to perform lithography on reconstituted wafers 100 and still meet the overlay requirements.

Site-by-Site Alignment

Site-by-site alignment is an approach that had been used in the early days of lithography when chip location (on silicon wafers) was less precise. Site-by-site alignment is thus worthy of consideration for patterning reconstituted wafers. In general, for arbitrary chip locations with random errors, site-by-site alignment provides a method of accurately aligning the reticle of the exposure tool to each chip. As chip location became more precise, enhanced global alignment (EGA) became the method of choice because it is much faster. While site-by-site alignment measures the location and orientation of each chip (chip) on the wafer, EGA measures the location of a small number of alignment marks on the wafer. The difference in the number of measurements required for the two approaches can be significant, e.g., several hundred chips measured site-by-site on a 300-mm wafer, while EGA typically measures 3-5 alignment sites.

Because each alignment measurement takes a significant fraction of a second, the reduction of several hundred measurements greatly improves overall production throughput. However, the EGA alignment method only works if the locations of the chips are accurately controlled and predictable, which is generally not the case for reconstituted wafers 100. On the other hand, while the use of site-by-site alignment on reconstituted wafers 100 can provide sufficient accuracy in alignment and overlay, it leads to an unacceptable reduction in throughput for a manufacturing environment.

Sub-Field Enhanced Global Alignment (SEGA) Method

An aspect of the present disclosure is directed to methods of performing sub-field enhanced global alignment (SEGA) on one or more reconstituted wafers as part of a lithographic process having an overlay requirement in cases where the errors in the chip locations do not allow for EGA to be performed in a single step over all of the chips. The SEGA method optimizes the throughput benefits of an EGA process with the superior alignment capabilities of a site-by-site alignment process to achieve alignment over all of the chips to within the overlay requirement. The SEGA method can be thought of as a hybrid alignment method that judiciously combines the benefits site-by-site alignment with EGA methods.

The overlay requirement for a given lithographic process is dictated by the device (chip) requirements. Smaller linewidths tend to require tighter overlay. The overlay requirement is generally determined to be a fraction of the minimum linewidth (typically approximately ¼ of the linewidth).

The chip location error on reconstituted wafer 100 will typically have both a random and a systematic component. The pick and place tool used to place the chips on the reconstituted wafer will itself have its own random and systematic errors, and the shrinkage of package material 110 that constitutes carrier 102 will also give rise to random and systematic errors. The carrier shrinkage will nominally have a systematic signature that is representative of the curing process, the thickness of the material, the material properties, and the size (and number) of chips embedded in the material. The random component may be composed of variations in the curing process or the material properties and thickness.

An aspect of the SEGA method described herein involves exploiting the fact that there exists at least one sub-field on a given reconstituted wafer 100 where one can achieve the overlay required for a given systematic and random error in the chip placement for a given overlay requirement while using an EGA-type approach within the sub-field. In an example SEGA method, two or more subfields are identified where EGA can be performed within each subfield to within the overlay requirement of the particular lithography process being carried out, such as non-critical-layer lithography using in back-end packaging. Here, the EGA methods need not involve measuring alignment marks per se, but instead can rely on measurements of the chip locations, as described below.

For example, the systematic and random errors in the chip placement may be too large to use an EGA-type approach on an entire (300 mm) reconstituted wafer 100 for a specific overlay requirement, but the systematic and random errors within a sub-field S (such as ¼ of the reconstituted wafer) may be sufficiently small so that an EGA-type approach will work within that sub-field. The size of the sub-field S is determined in one example by measuring one or more wafers from the process (e.g., multiple wafers from a common lot of wafers processed in the same or similar manner) prior to processing multiple wafers, e.g., an entire lot of production wafers. Thus, a first set of reconstituted wafers may be used for determining the size and locations of sub-fields S, while the SEGA method may be applied to this first set, to a second set from the same (common) lot, or to both sets. This is because reconstituted wafers from a common lot or group will generally have the same or similar chip arrangement configuration (i.e., be subject to generally the same placement errors) and thus the same sub-field configuration.

Figure 6:
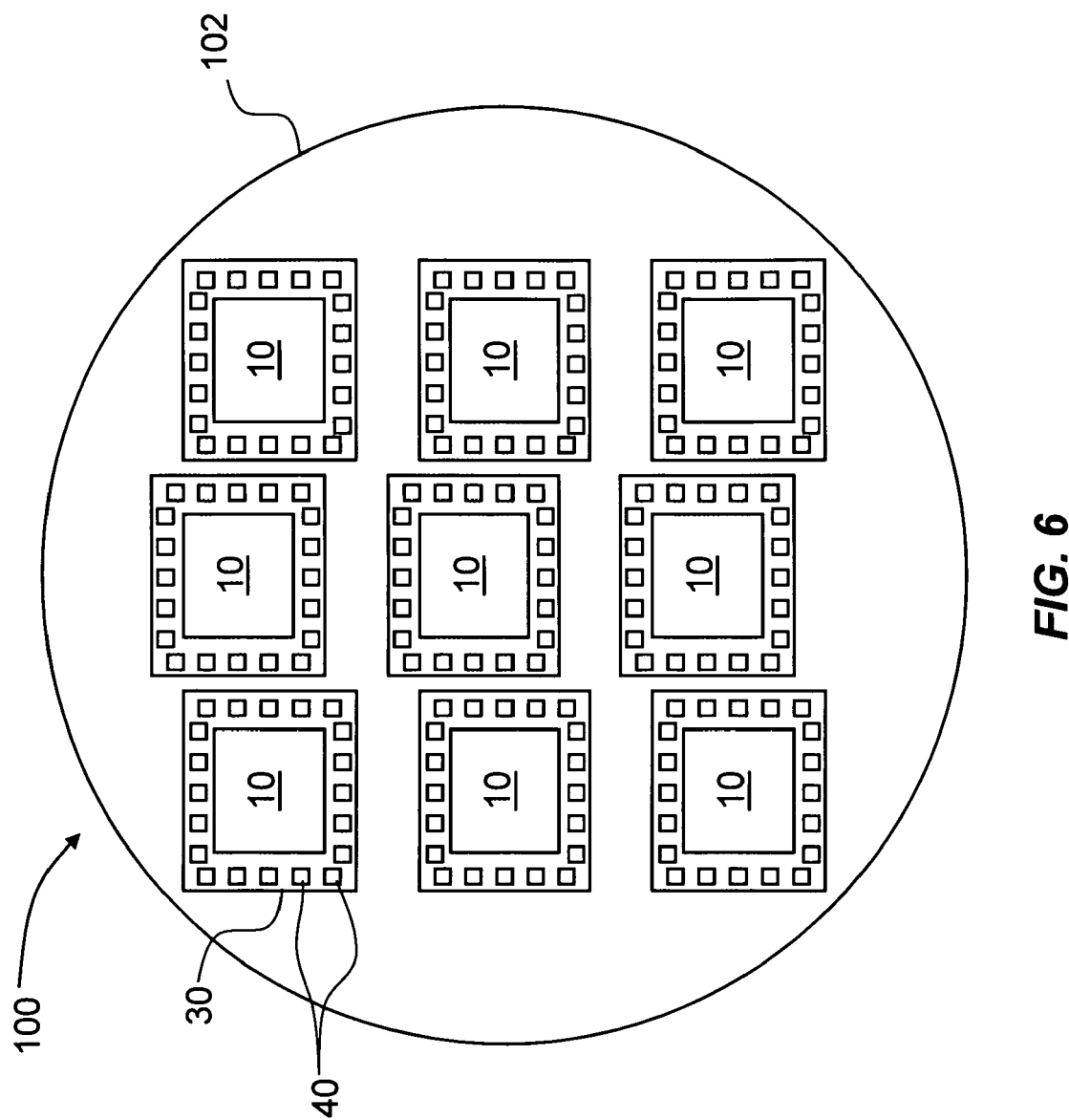
FIG. 6 is a plan view of an example reconstituted wafer that illustrates one type of systematic error, whereby the locations of the center column of chips is displaced relative to the surrounding columns.
Figure 7:
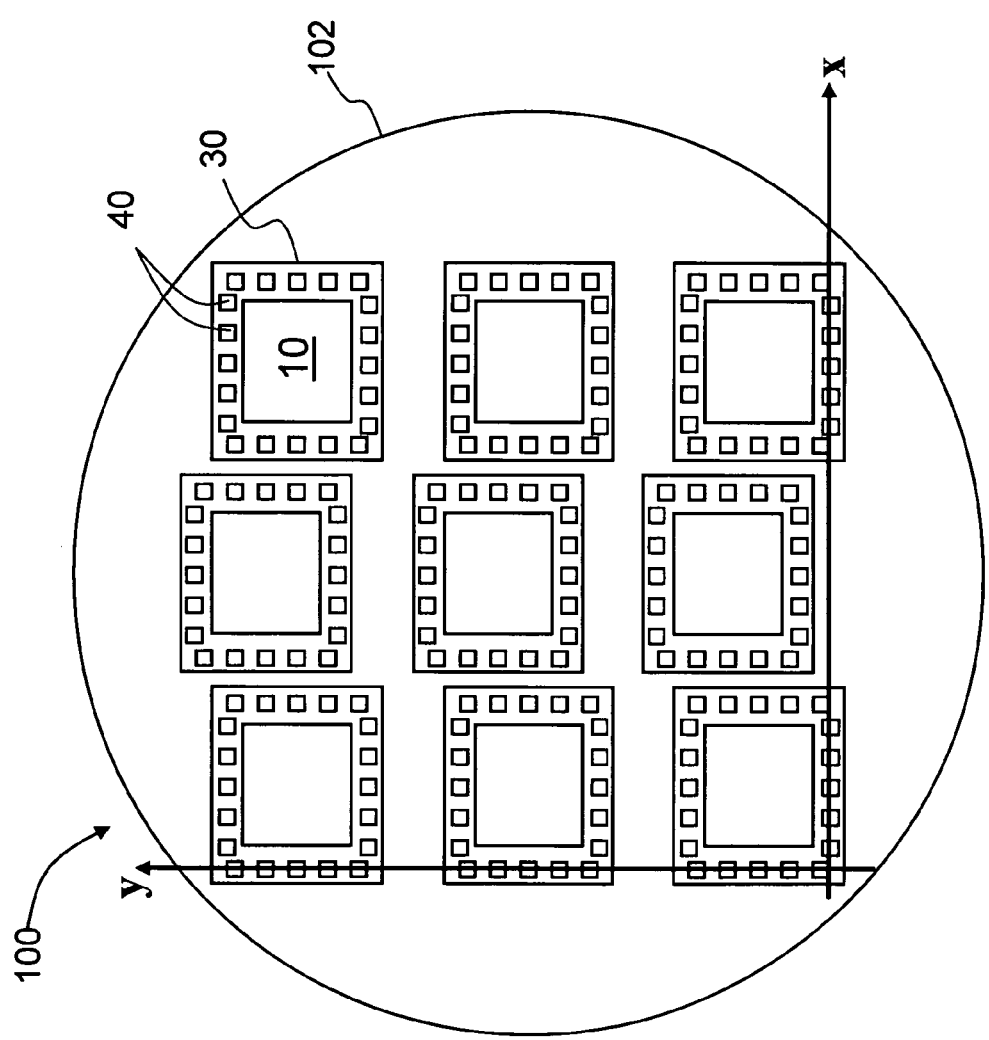
FIG. 7 is similar to FIG. 6 and shows a single x-y coordinate system that will not be effective in performing EGA over all of the chips at one time due to the center column offset.

FIG. 6 illustrates one type of systematic error that can exist on a reconstituted wafer 100, whereby the locations of the center column of chip 10 are displaced relative to the side columns. As illustrated in FIG. 7, no full-wafer, conventional EGA algorithm can adequately compensate for this type of error. A single x-y coordinate system is shown in FIG. 7, and it can be seen that the center chips 10 are not equally aligned with the x-y axes because the placement error is not linear across the wafer.

Figure 8:
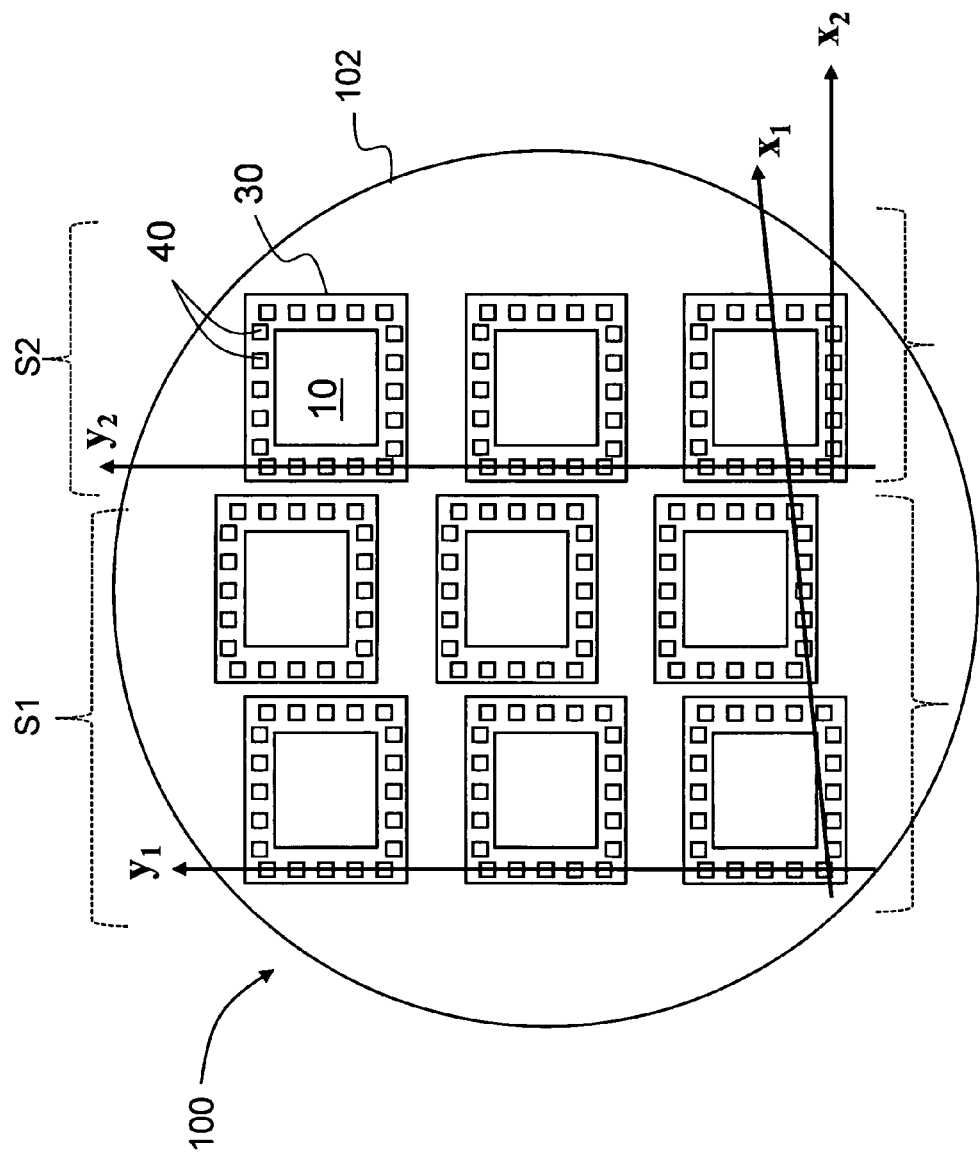
FIG. 8 is similar to FIG. 6, except that the reconstituted wafer is divided into two sub-fields each having its own x-y coordinate system, with EGA performed independently in each of the respective sub-fields.

However, with reference now to FIG. 8, by partitioning the wafer into sub-fields S (such as halves with sub-fields S1 and S2 as shown, or in other examples thirds with sub-fields S1-S3, or in quarters with sub-fields S1-S4, etc.), it becomes possible to perform an EGA-type alignment on the different sub-fields independently. In FIG. 8, a global, linear EGA x-y coordinate system such as shown in FIG. 7 would be ineffective in locating all the chips 10 correctly. However, with the reconstituted wafer 100 partitioned into sub-fields S1 and S2, EGA can be performed individually (i.e., separately) in each sub-field. Coordinate axes x1,y1 are used to align to the left two columns in sub-field S1, while coordinate axes x2,y2 are used in sub-field S2 to align to the right column.

Figure 9:
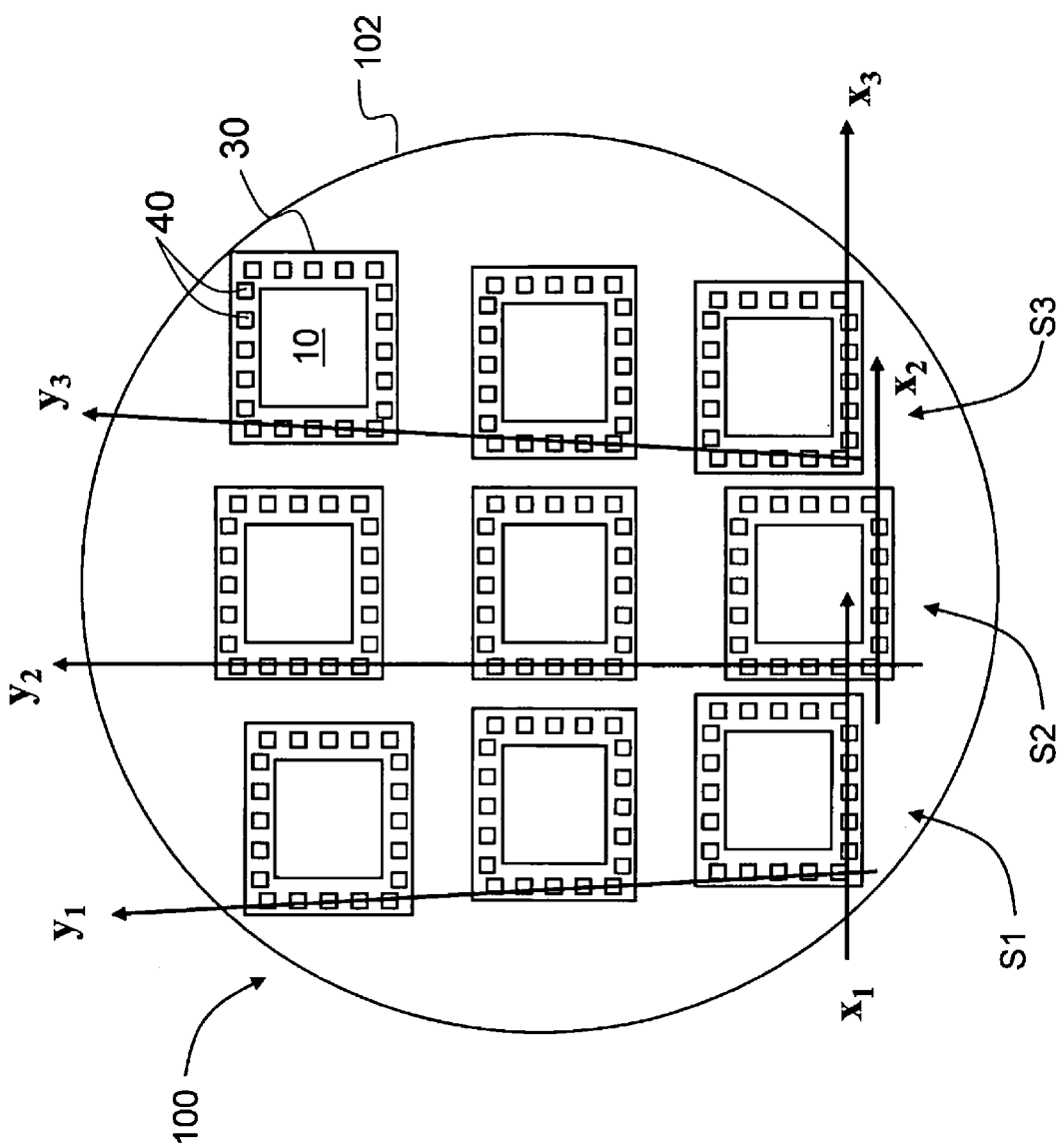
FIG. 9 is similar to FIG. 8, but with a different chip placement error that calls for the reconstituted wafer to be divided into three sub-fields each having its own x-y coordinate system for performing EGA alignment within the respective sub-fields.

FIG. 9 is similar to FIG. 8, but has a different systematic error in the chip placement that requires the reconstituted wafer 100 to be partitioned into three sub-fields S1-S3 that allows for use of sub-field EGA on each column in each sub-field. Coordinate axes x1,y1 in sub-field S1 are used to align to the left column, coordinate axes x2,y2 in sub-field S2 are used to align to the center column, and coordinate axes x3,y3 in sub-field S3 are used to align the right column.

Wafer chip maps similar to FIG. 6 through FIG. 9 are often used to determine the optimum wafer partitioning to achieve the desired overlay. Typically, the wafer chip map from a single wafer in a group of wafers (e.g. from a "lot" of wafers) can be measured as the basis for the partitioning calculation that determines the number and spatial extent of the different sub-fields S. The wafer chip map measurement can be made off-line with a separate metrology tool, or can be made with the lithography tool itself.

Example SEGA Method

An example method of performing SEGA alignment in a lithography process that has an overlay requirement is as follows:

1) Provide or form one or more reconstituted wafers using, for example, the methods described above.
2) Measure the chip locations on a representative number of the reconstituted wafers (e.g., 1-25 wafers). For each chip, measure both the average chip location and the wafer-to-wafer variance in the chip location. Chip locations can be measured using traditional alignment marks (such as grating-type structures) within the individual die or by using a machine-vision type system to locate visible features within the die.
3) Calculate the average chip location error (i.e., the difference in the actual chip locations relative to the corresponding ideal chip locations) and compare to the variance in the chip locations. Take the larger of these two values.
4) Model the chip location errors (or the variance, which ever is larger from step 3) relative to an ideal Cartesian grid in terms of the linear and non-linear components.
5) Compare the non-linear component of the chip location error (or the variance) relative to the overlay requirement for the lithography process.
6) Identify two or more sub-fields S that have their non-linear chip-location error component (or variance) less than the overlay requirement.
7) Perform SEGA (sub-field EGA) over the respective sub-fields S identified in step 6).

Once the calculation is performed on a representative number of wafers, the SEGA process can then be performed on production (i.e., non-sample) wafers without further analysis.

Note also the SEGA of step 7) can be accomplished by using traditional alignment marks, or by using a machine vision system to identify and locate specific features in the die (for example, locating the "lower-left-corner" of the die).

In an example embodiment, the above method is carried out at least in part using a computer, wherein chip-location measurement data is stored in a computer-readable medium and a processor performs the necessary calculations to identify the sections (sub-fields) and to carry out the SEGA method as described herein.

It will be apparent to those skilled in the art that various modifications and variations can be made to the present disclosure without departing from the spirit and scope of the disclosure. Thus it is intended that the present disclosure cover the modifications and variations of this disclosure provided they come within the scope of the appended claims and their equivalents.

What is claimed is:

1. A method of performing alignment in a lithography process having an overlay requirement, comprising:
    providing at least one reconstituted wafer that includes a plurality of chips supported by a carrier and arranged at different locations, wherein the chip locations preclude performing a single enhanced global alignment of the chips over the entire wafer within the overlay requirement;
    measuring the chip locations on the at least one reconstituted wafer;
    identifying, based on the measured chip locations, two or more sub-fields of the reconstituted wafer where enhanced global alignment can be separately performed to within the overlay requirement; and performing separate enhanced global alignments within the respective two or more sub-fields.

2. The method of claim 1, wherein said measuring comprises measuring an average chip location for each chip, and a wafer-to-wafer variance of each chip location.

3. The method of claim 2, wherein said identifying comprises:
calculating an average chip location error based on the measured average chip locations;
modeling the larger of the average chip location error and said variance using linear and non-linear components of an ideal Cartesian grid; and
comparing said non-linear component to the overlay requirement.

4. The method of claim 1, wherein said measuring is performed on one or more of the reconstituted wafers from a common group of reconstituted wafers.

5. The method of claim 4, wherein one or more reconstituted wafers is between 1 and 25 wafers.

6. The method of claim 4, wherein the lithography process includes wafer-level packaging.

7. A method of aligning chips placed on a reconstituted wafer in a lithography process, comprising:
establishing two or more sub-fields on the reconstituted wafer wherein a given systematic and random error in the chip placement is within the overlay requirement; and
performing respective two or more enhanced global alignments of one or more chips within the respective two or more sub-fields.

8. The method of claim 7, further comprising establishing a size and location of the two or more sub-fields by performing chip measurements of one or more sample reconstituted wafers.

9. The method of claim 8, further comprising:
repeating the performing of the two or more enhanced global alignments for the respective two or more sub-fields on non-sample reconstituted wafers.

10. The method of claim 7, further comprising measuring an average chip location for each chip, and a wafer-to-wafer variance of each chip location based on ideal chip locations.

11. The method of claim 10, wherein further comprising:
calculating an average chip location error based on the measured average chip locations;
modeling the larger of the average chip location error and said variance using linear and non-linear components of an ideal Cartesian grid; and
comparing said non-linear component to the overlay requirement and establishing the two or more sub-fields by having the non-linear component be with the overlay requirement within each of the two or more sub-fields.

12. The method of claim 11, wherein said measuring is performed on one or more wafers from a common lot of wafers.

13. The method of claim 12, wherein one or more wafers is between 1 and 25 wafers.

14. The method of claim 7, wherein the lithography process includes performing wafer-level fan-out packaging.

15. A method of performing alignment of reconstituted wafers in a lithography process having an overlay requirement, comprising:
forming a first set of multiple reconstituted wafers each having a carrier with chips operably supported thereby at different locations such that a single enhanced global alignment cannot be performed for all of the chips on a given reconstituted wafer in the first set;
measuring the chip locations on the multiple wafers; and
determining, based on the measured chip locations, sub-fields over which enhanced global alignment can be performed within the overlay requirement.

16. The method of claim 15, further including:
performing individual enhanced global alignments for the respective sub-fields for at least one of the first set of reconstituted wafers and a second set of multiple reconstituted wafers having the same general chip locations as the first set of reconstituted wafers.

17. The method of claim 15, wherein said determining includes:
calculating average chip locations;
calculating an average chip location error based on the calculated average chip locations;
calculating a wafer-to-wafer variance for each chip location;
modeling the larger of the average chip location error and the wafer-to-wafer chip location variance using linear and non-linear components of an ideal Cartesian grid; and
comparing said non-linear component to the overlay requirement.

18. The method of claim 17, wherein the first and second sets of reconstituted wafers are from a common lot of reconstituted wafers.

19. The method of claim 18, wherein the common lot of wafers includes up to 25 wafers.

20. The method of claim 15, wherein the lithography process includes fan-out wafer-level packaging.

* * * * *